United States Patent [19]
Yoshikawa

[11] Patent Number: 5,734,612
[45] Date of Patent: Mar. 31, 1998

[54] SEMICONDUCTOR MEMORY DEVICE WITH A PLURALITY OF MEMORY CELLS CONNECTED TO BIT LINES AND METHOD OF ADJUSTING THE SAME

[75] Inventor: Kuniyoshi Yoshikawa, Tokyo, Japan

[73] Assignee: Kabushiki Kaisha Toshiba, Kawasaki, Japan

[21] Appl. No.: 674,820

[22] Filed: Jul. 3, 1996

[30] Foreign Application Priority Data

Jul. 5, 1995 [JP] Japan ................................ 7-169962

[51] Int. Cl.$^6$ .................................................. G11C 16/00
[52] U.S. Cl. ................ 365/185.13; 365/185.22; 365/185.24
[58] Field of Search ............. 365/185.13, 185.09, 365/185.21, 185.22, 185.08, 185.24

[56] References Cited

U.S. PATENT DOCUMENTS

| | | | |
|---|---|---|---|
| 5,355,330 | 10/1994 | Hisamoto et al. | 365/185.08 |
| 5,596,525 | 1/1997 | Iwahashi | 365/185.17 |

Primary Examiner—Tan T. Nguyen
Attorney, Agent, or Firm—Finnegan, Henderson, Farabow, Garrett & Dunner, L.L.P.

[57] ABSTRACT

When the upper limit value of a leakage current allowed by a read.detection/write circuit connected to a plurality of bit lines to read and write data from and in memory cells is represented by IL, Vs satisfies $$Vgh - Vs - Vta + \frac{1.15\sigma^2}{s} < s \left\{ 5 - 1.5Vd + 0.4343\ln\frac{IL}{N-1} \right\}$$

(ln is the natural logarithm)

where Vgh is the potential of a non-selected word line, Vta is the average threshold voltage of the memory cells, e is the standard deviation, s is the subthreshold coefficient, Vd is the potential of the bit lines, and Vs is the potential of a source line.

20 Claims, 4 Drawing Sheets

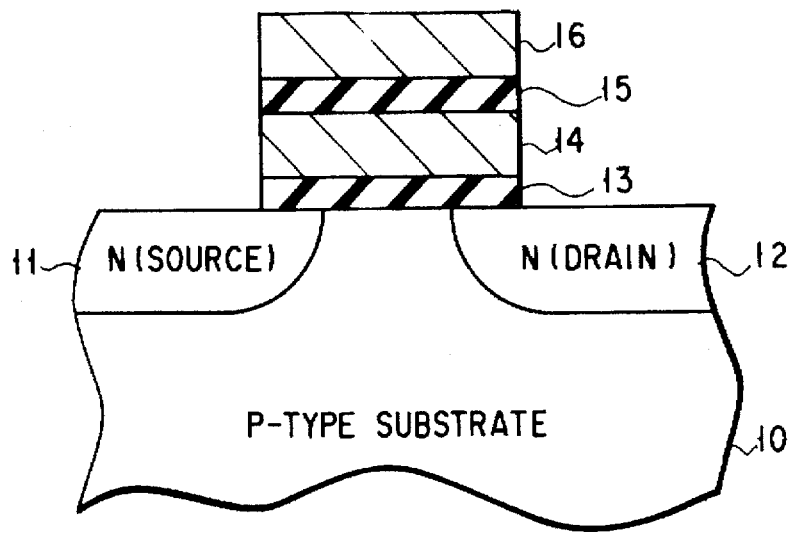
F I G. 1
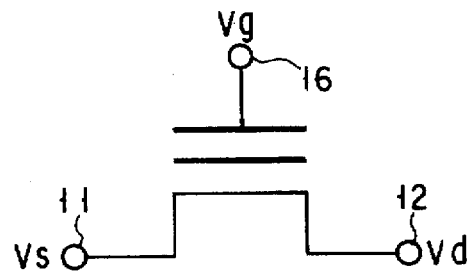
F I G. 2
| | WRITE OPERATION (ELECTRON INJECTION) | ERASE OPERATION (ELECTRON EXTRACTION) | READ OPERATION |
|---|---|---|---|
| Vg | H (~12V) | L (~0V) | H (~Vcc) |
| Vd | H (~6.5V) | FLOATING | H (~1.5V) |
| Vs | 0V | H (~12V) | 0V |
F I G. 3

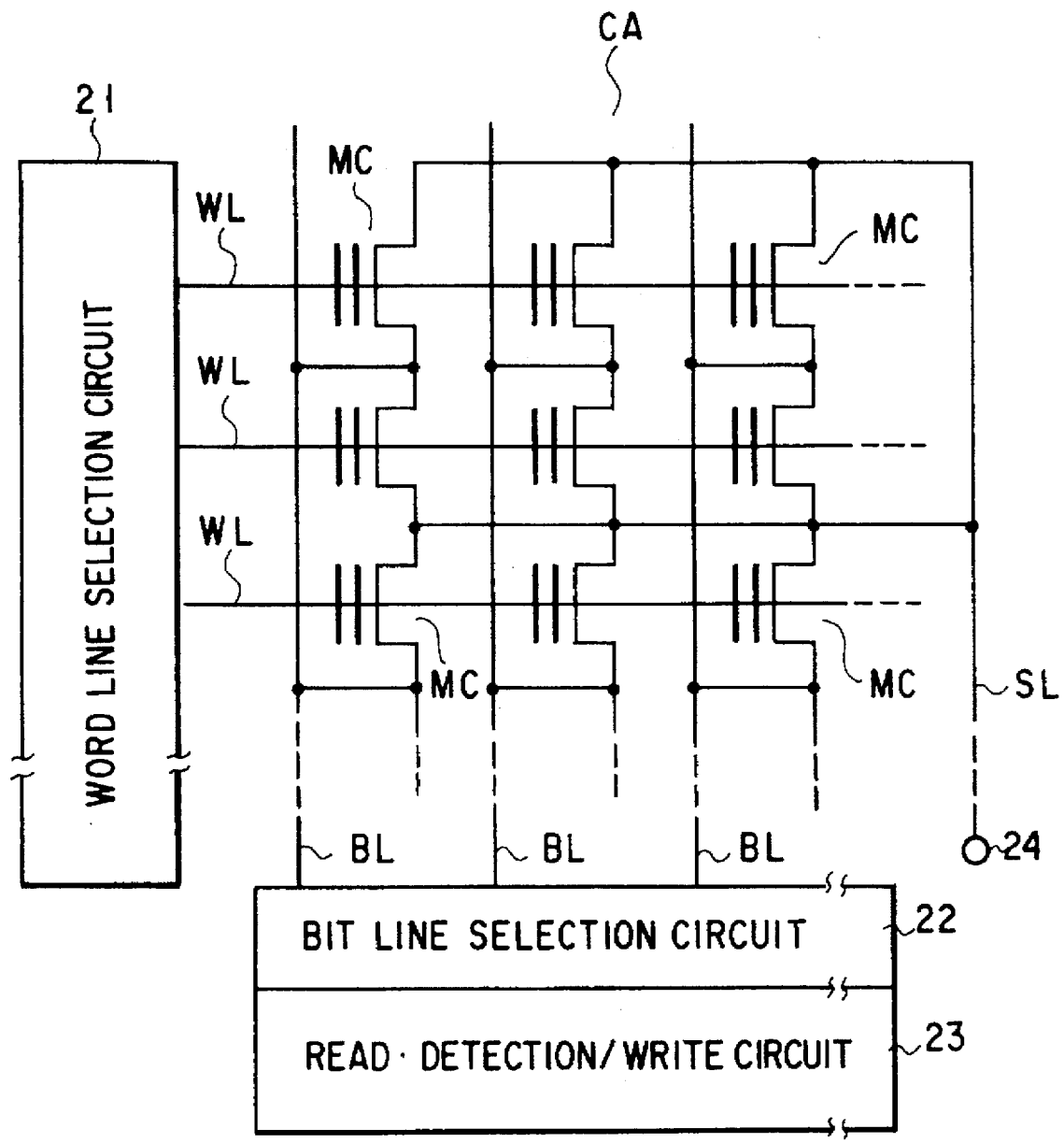
F I G. 4

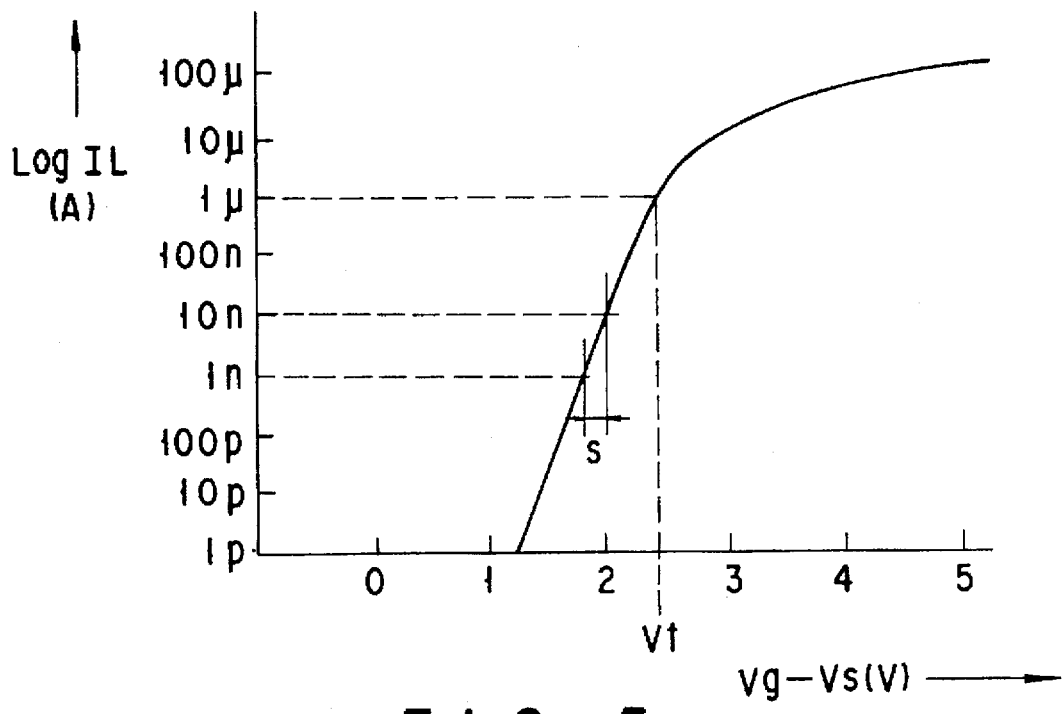
F I G. 5
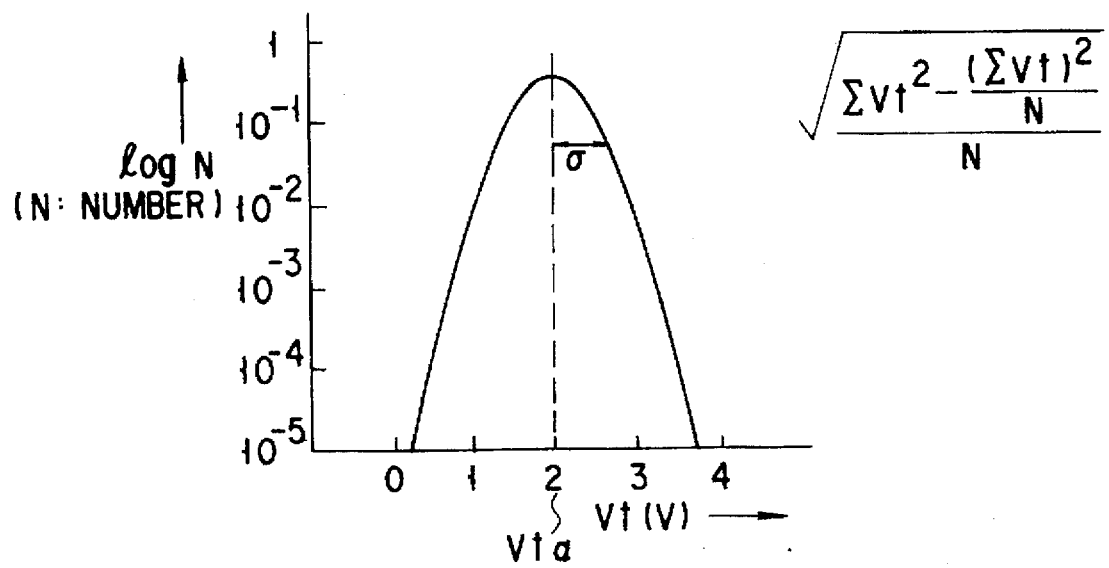
$\sigma$: STANDARD DEVIATION DEFINED BY
$$\frac{\sqrt{\Sigma Vt^2 - \frac{(\Sigma Vt)^2}{N}}}{N}$$
F I G. 6

SEMICONDUCTOR MEMORY DEVICE WITH A PLURALITY OF MEMORY CELLS CONNECTED TO BIT LINES AND METHOD OF ADJUSTING THE SAME

BACKGROUND OF THE INVENTION

1. Field of the Invention

The present invention relates to a semiconductor memory device and, more particularly, to a nonvolatile semiconductor memory device in which a plurality of nonvolatile memory cells are arranged in an array by connecting the plurality of memory cells to bit lines, and a method of adjusting the same.

2. Description of the Related Art

In recent years, in the field of nonvolatile semiconductor memory devices, the integration degree has been increased by using a flash type cell structure. A nonvolatile semiconductor memory device with this flash type cell structure uses a nonvolatile memory cell having a two-layered gate structure as a memory cell. The nonvolatile semiconductor memory device having the nonvolatile memory cell can realize a one-transistor one-cell structure and has a characteristic feature of increasing the integration degree.

In the nonvolatile semiconductor memory device, however, since an erase operation is performed for a plurality of memory cells at once, the threshold voltage varies in a memory cell array, and a circuit may malfunction in a case of many memory cells in an excessively erased state, resulting in an erroneous operation. That is, a memory cell in an excessively erased state greatly decreases in threshold voltage, so that a leakage current value becomes large in a non-selected state. If the total value of leakage currents flowing through non-selected memory cells connected to the same bit line accounts for a certain ratio or more of a current value flowing through memory cells in which data is written, it is difficult to identify a current flowing through the bit line during a data read operation as a current based on a current flowing through the selected memory cells or a leakage current flowing through the non-selected memory cells because the threshold voltage of the selected memory cells is low. As a result, data may be erroneously detected.

In a conventional nonvolatile semiconductor memory device, therefore, the criterion of a threshold voltage after a data erase operation, the upper limit of the variation, and the like are ambiguous. The relationship between the designs of a read.detection circuit and a write circuit and the electrical characteristics of memory cells is not clear, making it very difficult to design semiconductor memory devices.

SUMMARY OF THE INVENTION

It is therefore an object of the present invention to provide a semiconductor memory device capable of predicting the characteristics of a memory cell array based on the electrical characteristics of a single memory cell and shortening the design period of a semiconductor memory device, and a method of adjusting the same.

According to one aspect the present invention relates to a semiconductor memory device comprising a plurality of word lines and a plurality of bit lines which are formed to cross each other, a memory cell array having a plurality of memory cells arrayed in a matrix, some of the memory cells arrayed in the same row being commonly connected to a corresponding one of the plurality of word lines, and some of the memory cells arrayed in the same column being commonly connected to a corresponding one of the plurality of bit lines, and a read.detection/write circuit connected to the plurality of bit lines to read, detect, and write data with respect to the memory cells, wherein the following inequality is established $$Vgh - Vs - Vta + \frac{1.15\sigma^2}{s} < s \left\{ 5 - 1.5Vd + 0.4343 \ln \frac{IL}{N-1} \right\}$$

(ln is the natural logarithm)
where IL is an upper limit value of a leakage current allowed by the read.detection/write circuit, N (N is a positive integer) is the number of memory cells commonly connected to the one bit line, Vgh is a potential of the word lines to which non-selected memory cells are connected, Vta is an average threshold voltage of the plurality of memory cells in the memory cell array, σ is a standard deviation of threshold voltages, s is a subthreshold coefficient of the memory cell, Vd is a potential of the bit lines, Vs is a source potential of the memory cells, and ln is a natural logarithm.

The present invention also relates to a semiconductor memory device comprising, a plurality of word lines and a plurality of bit lines which are formed to cross each other, a memory cell array having a plurality of memory cells arrayed in a matrix, some of the memory cells arrayed in the same row being commonly connected to a corresponding one of the plurality of word lines, a switching circuit for changing the number of memory cells to be connected to one bit line in accordance with a data read.detection operation and a data write operation such that NR (NR is a positive integer) memory cells are connected to each of the bit line in the data read.detection operation, and NP (NP is a positive integer) memory cells are connected to each of the bit lines in the data write operation, and a read.detection/write circuit connected to the plurality of bit lines and having a read.detection section for reading and detecting data from the memory cells and a write section for writing data in the memory cells, wherein an average threshold voltage Vta is set larger than either of values given by $$Vgr - Vsr + \frac{1.15\sigma^2}{s} - s \left\{ 5 - 1.5Vdr + 0.4343 \ln \frac{IRL}{NR-1} \right\}$$

and $$Vgp - Vsp + \frac{1.15\sigma^2}{s} - s \left\{ 5 - 1.5Vdp + 0.4343 \ln \frac{IPL}{NP-1} \right\}$$

where IRL is an upper limit value of a leakage current allowed by the read.detection section in the data read.detection operation, IPL is an upper limit value of a leakage current allowed by the write section in the data write operation, Vgr is a potential of the word lines connected to non-selected memory cells in the data read.detection operation, Vdr is a potential of the bit lines in the data read.detection operation, Vsr is a source potential of the memory cell in the data read.detection operation, Vgp is a potential of the word lines connected to non-selected memory cells in the data write operation, Vdp is a potential of the bit lines in the data write operation, Vsp is a source potential of the memory cells in the data write operation, Vta is the average threshold voltage of the plurality of memory cells in the memory cell array, σ is a standard deviation of threshold voltage, s is a subthreshold coefficient of the memory cells, and in is a natural logarithm.

The present invention also relates to a semiconductor memory device comprising, a plurality of word lines and a plurality of bit lines which are formed to cross each other, a memory cell array having a plurality of memory cells arrayed in a matrix, some of the memory cells arrayed in the same row being commonly connected to a corresponding one of the plurality of word lines, a switching circuit for changing the number of memory cells to be connected to one bit line in accordance with a data read.detection operation and a data write operation such that NR memory cells are connected to each of the bit line in the data read.detection operation, and NP memory cells are connected to each of the bit lines in the data write operation, and a read.detection/write circuit connected to the plurality of bit lines and having a read.detection section for reading and detecting data from the memory cells and a write section for writing data in the memory cells, wherein the following relation is satisfied $$Vgr - Vgp + Vsp - Vsr + 1.5s(Vdr - Vdp) +$$

$$0.4343s \ln \frac{IPL(NR-1)}{IRL(NP-1)} = 0$$

where IRL is an upper limit value of a leakage current allowed by the read.detection section in the data read.detection operation, IPL is an upper limit value of a leakage current allowed by the write section in the data write operation. Vgr is a potential of the word lines connected to non-selected memory cells in the data read.detection operation, Vdr is a potential of the bit lines in the data read.detection operation, Vgp is a potential of the word lines connected to non-selected memory cells in the data write operation, Vdp is a potential of the bit lines in the data write operation, Vta is the average threshold voltage of the plurality of memory cells in the memory cell array, σ is a standard deviation of threshold voltage, s is a subthreshold coefficient of the memory cells, and ln is a natural logarithm.

The present invention also relates to a method of adjusting a semiconductor memory device which comprises, a plurality of word lines and a plurality of bit lines which are formed to cross each other, a memory cell array having a plurality of memory cells which are arrayed in a matrix and constituted by nonvolatile transistors whose threshold voltage change by injecting/extracting electrons, some of the memory cells arrayed in the same row being commonly connected to a corresponding one of the plurality of word lines, and some of the memory cells arrayed in the same column being commonly connected to a corresponding one of the plurality of bit lines, and a read.detection/write circuit connected to the plurality of bit lines to read, detect, and write data with respect to the memory cells, comprising repeatedly injecting/extracting the electrons to adjust the memory cells such that an average threshold voltage Vta of the memory cells and a standard deviation σ of the threshold voltage satisfy $$Vgh - Vs - Vta + \frac{1.15\sigma^2}{s} < s \left\{ 5 - 1.5Vd + 0.4343\ln\frac{IL}{N-1} \right\}$$

(ln is the natural logarithm)
where IL is an upper limit value of a leakage current allowed by the read.detection/write circuit, N (N is a positive integer) is the number of memory cells commonly connected to the one bit line, Vgh is a potential of the word lines to which non-selected memory cells are connected, Vta is the average threshold voltage of the plurality of memory cells in the memory cell array, σ is the standard deviation of threshold voltage, s is a subthreshold coefficient of the memory cell, Vd is a potential of the bit lines, Vs is a source potential of the memory cells, and ln is a natural logarithm.

The present invention also relates to a semiconductor memory device comprising, a plurality of word lines and a plurality of bit lines which are formed to cross each other, a memory cell array having a plurality of memory cells which are arrayed in a matrix and each of which can be set in states of at least three threshold voltages, some of the memory cells arrayed in the same row being commonly connected to a corresponding one of the plurality of word lines, and some of the memory cells arrayed in the same column being commonly connected to a corresponding one of the plurality of bit lines, and a read.detection/write circuit connected to the plurality of bit lines to read, detect, and write data with respect to the memory cells, wherein the following inequality is established $$Vgh - Vs - Vta + \frac{1.15\sigma^2}{s} < s \left\{ 5 - 1.5Vd + 0.4343\ln\frac{IL}{N-1} \right\}$$

(ln is the natural logarithm)
where IL is an upper limit value of a leakage current allowed by the read.detection/write circuit, N (N is a positive integer) is the number of memory cells commonly connected to the one bit line, Vgh is a potential of the word lines to which non-selected memory cells are connected, Vta is an average threshold voltage of at least the three threshold voltages of the plurality of memory cells in the memory cell array, σ is a standard deviation of threshold voltages, s is a subthreshold coefficient of the memory cell, Vd is a potential of the bit lines, Vs is a source potential of the memory cells, and ln is a natural logarithm.

The present invention also relates to a method of adjusting a semiconductor memory device which comprises, a plurality of word lines and a plurality of bit lines which are formed to cross each other, a memory cell array having a plurality of memory cells which are arrayed in a matrix and each of which can be set in states of at least three threshold voltages, same of the memory cells arrayed in the same row being commonly connected to a corresponding one of the plurality of word lines, and some of the memory cells arrayed in the same column being commonly connected to a corresponding one of the plurality of bit lines, and a read.detection/write circuit connected to the plurality of bit lines to read, detect, and write data with respect to the memory cells, comprising repeatedly injecting/extracting the electrons to adjust the memory cells such that an average threshold voltage Vta of the memory cells and a standard deviation σ of the threshold voltages satisfy $$Vgh - Vs - Vta + \frac{1.15\sigma^2}{s} < s \left\{ 5 - 1.5Vd + 0.4343\ln\frac{IL}{N-1} \right\}$$

(ln is the natural logarithm)
where IL is an upper limit value of a leakage current allowed by the read.detection/write circuit, N (N is a positive integer) is the number of memory cells commonly connected to the one bit line, Vgh is a potential of the word lines to which non-selected memory cells are connected, Vta is the average threshold voltage of the plurality of memory cells in the memory cell array, σ is the standard deviation of threshold voltages, s is a subthreshold coefficient of the memory cell, Vd is a potential of the bit lines, Vs is a source potential of the memory cells, and ln is a natural logarithm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is sectional view showing the element structure of a nonvolatile memory cell used in a nonvolatile semiconductor memory device according to the present invention;

FIG. 2 is an equivalent circuit diagram of the nonvolatile memory cell in FIG. 1;

FIG. 3 is a table showing the list of voltages applied to the nonvolatile memory cell in FIGS. 1 and 2 in data write, erase, and read operations;

FIG. 4 is a circuit diagram showing a semiconductor memory device according to the first embodiment of the present invention;

FIG. 5 is a graph showing the current-voltage characteristics of a single nonvolatile memory cell;

FIG. 6 is a graph showing the distributed state of the threshold voltages of nonvolatile memory cells.

DETAILED DESCRIPTION OF THE PREFERRED EMBODIMENTS

Figure 7:
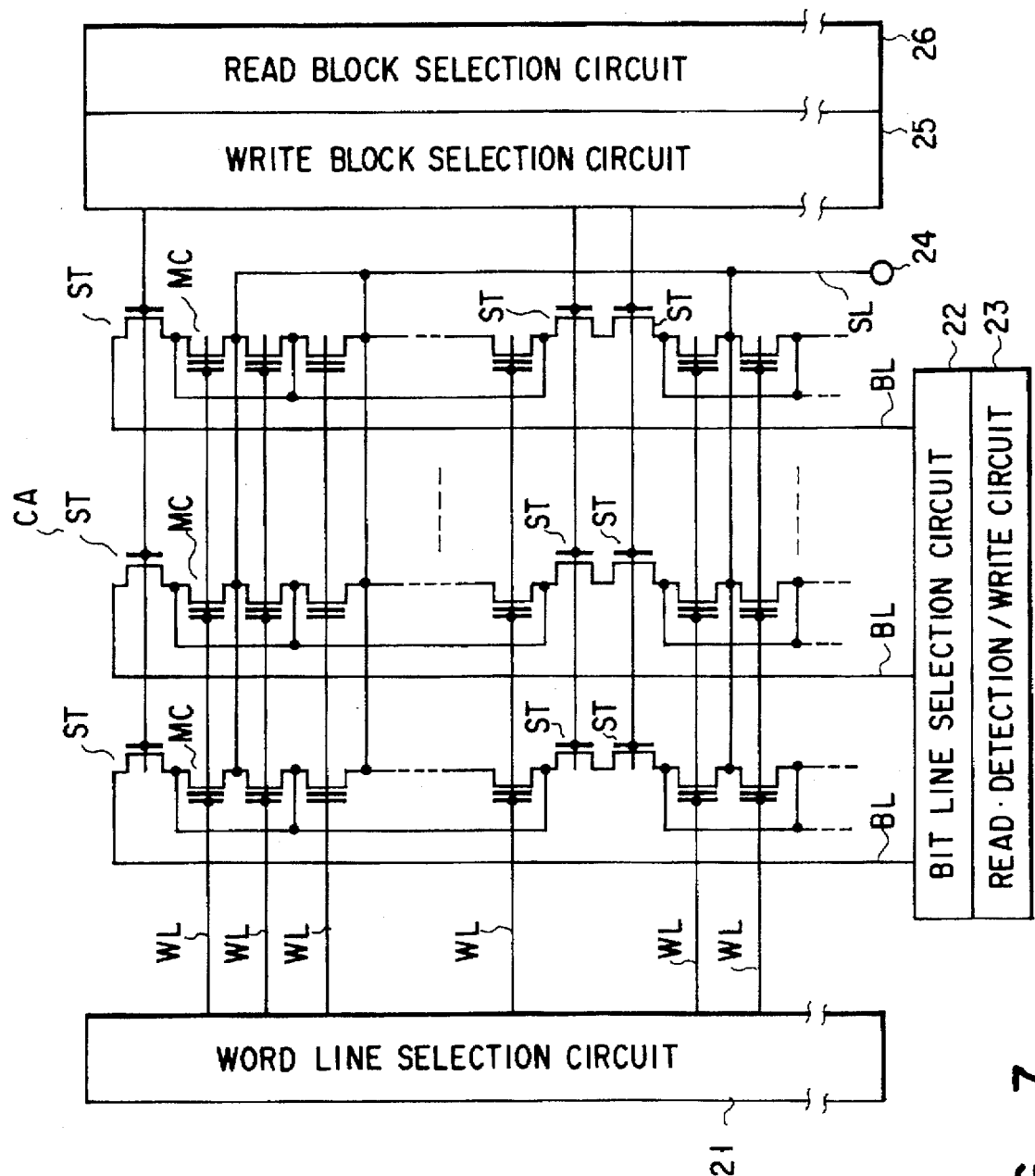
FIG. 7 is a circuit diagram showing a semiconductor memory device according to the second embodiment of the present invention.

The embodiments of a nonvolatile semiconductor memory device and a method of adjusting the same according to the present invention will be described below.

FIG. 1 shows an example of a memory cell used in the nonvolatile semiconductor memory device according to the present invention. A source 11 and a drain 12 respectively consisting of n-type diffusion regions are formed separate from each other in the surface region of a p-type semiconductor substrate 10. A floating gate 14 consisting of, e.g., polysilicon is formed on the substrate between the source 11 and the drain 12 via a gate insulating film 13. A control gate 16 consisting of, e.g., polysilicon is formed on the floating gate 14 via a gate insulating film 15. In this manner, the nonvolatile memory cell normally has a two-layered gate structure.

FIG. 2 shows an equivalent circuit of the memory cell having the element structure as in FIG. 1. In data write, erase, and read operations with respect to this memory cell, voltages Vs, Vd, and Vg are applied to the source 11, the drain 12, and the control gate 16, respectively. A plurality of such memory cells are arrayed in a matrix to constitute a memory cell array. The control gates of memory cells in the same row are connected to a common word line, and the drains of memory cells in the same column are connected to a common bit line (to be described later).

FIG. 3 shows an example of the values of the voltages Vs, Vd, and Vg respectively applied to the source 11, the drain 12, and the control gate 16 in data write, erase, and read operations in the above memory cell.

In a data write operation, a high voltage H (voltage of about 12 V), a high voltage H (voltage of about 6.5 V), and 0 V are applied as the gate voltage Vg, the drain voltage Vd, and the source voltage Vs, respectively. Upon this voltage application, a large channel current flows between the source and drain, and channel hot electrons (CHE) generated at this time are injected into the floating gate. A threshold voltage Vt of the memory cell upon this write operation becomes higher than that before the write operation.

In an erase operation, a low voltage L (voltage of about 0 V) is applied as the gate voltage Vg, the drain voltage Vd is set in a floating state, and a high voltage H (voltage of about 12 V) is applied as the source voltage Vs. In this erase operation, electrons accumulated in the floating gate are extracted to the source with a Fowler-Nordheim tunnel current due to an electrical field applied across the floating gate and the source. The threshold voltage Vt of the memory cell upon this erase operation becomes lower than that before the erase operation.

In a data read operation, a high voltage H (voltage of about a power supply voltage Vcc), a high voltage H (voltage of about 1.5 V) lower than Vcc, and 0 V are applied as the gate voltage Vg, the drain voltage Vd, and the source voltage Vs, respectively. At the time, the memory cell is turned on or off in accordance with an electron accumulated state in the floating gate, i.e., a high or low threshold voltage. A sense amplifier detects whether a current equal to or higher than a predetermined value flows through the memory cell, thereby reading data.

Note that data is written in units of memory cells (units of bits), and erased at once in units of a plurality of memory cells whose sources are commonly connected.

FIG. 4 is a circuit diagram showing the whole configuration of a semiconductor memory device according to the first embodiment of the present invention.

In FIG. 4, reference symbols MC denote nonvolatile memory cells each with a two-layered gate structure having an element structure as shown in FIG. 1 and an equivalent circuit as shown in FIG. 2. The plurality of memory cells MC are arrayed in a matrix to constitute a memory cell array CA. In the memory cell array CA, the control gates of the memory cells MC arrayed in the same row are connected to a common one of a plurality of word lines WL. In the memory cell array CA, the drains of the memory cells MC arrayed in the same column are connected to a common one of a plurality of bit lines BL. Further, the sources of all the memory cells MC in the memory cell array CA are connected to a common source line SL.

The plurality of word lines WL are selectively driven in accordance with an output from a word line selection circuit 21 which receives a selection signal such as a row address signal. The word line selection circuit 21 selects any one of the word lines WL on the basis of the row address signal and applies the voltage Vg having a value as shown in FIG. 3 to the selected word line.

The plurality of bit lines BL are connected to a bit line selection circuit 22. The bit line selection circuit 22 selects any one of the bit lines BL on the basis of a selection signal such as a column address signal. A read.detection/write circuit 23 is connected to the bit line selection circuit 22. The read.detection/write circuit 23 has a read.detection section and a write section. In data read, erase, and write operations with respect to the memory cells MC, the read.detection/write circuit 23 applies the voltage Vd having a value as shown in FIG. 3 to the bit line selected by the bit line selection circuit 22, thereby controlling the data read, erase, and write operations. The source line SL is connected to a source voltage terminal 24. In data read, erase, and write operations with respect to the memory cells MC, the voltage Vs having a value as shown in FIG. 3 is applied to the source voltage terminal 24.

As for a single nonvolatile memory cell, its current-voltage characteristics are known to have a curve shown in FIG. 5. That is, in FIG. 5, the abscissa indicates a voltage Vg–Vs (V) which is a difference between the control gate voltage Vg and the source voltage Vs of the memory cell, and the ordinate indicates the logarithmic value (logIL) of a current IL flowing through the memory cell. Generally, the threshold voltage Vt of the memory cell is defined by the gate value (Vg–Vs: Vs is normally 0 V) when a current of 1 (μA) flows.

Even if the Vg value is equal to or smaller than the threshold voltage, however, a leakage current flows. Assuming that s is the change amount of the gate voltage required to decrease this leakage current value to 1/10, this change amount s is called a subthreshold coefficient. In addition, the present inventors experimentally found that the value of a leakage current JL was given by the following equation:

$$JL = A \exp\{\ln 10(BVd+Vg-Vt-Vs)\} \quad (1)$$

where A and B are the constants of proportion.

It was found that N (N is a positive integer) memory cells had the distribution of the threshold voltages as shown in FIG. 6 when data was erased at once from the memory cells in the memory cell array CA by the above-described method. In FIG. 6, Vta is an average threshold voltage in the threshold voltage distribution. It was found that, when the number N of the memory cells was sufficiently large (about 10 or more), this distribution could be approximated as a continuous distribution by using a standard deviation σ

$$\frac{\exp\left\{\frac{-\left(\frac{Vt-Vta}{\sigma}\right)^2}{2}\right\}}{(\sqrt{2}\,\pi)\sigma} \quad (2)$$

The present inventors found that the total leakage current IL in (N–1) non-selected memory cells connected to one common bit line BL could be given by the following equation using the values of equations (1) and (2):

$$IL = (N-1)A \exp\left[\ln 10\left\{BVd+\frac{Vg-Vta-Vs}{s}\right\}\right] \times$$

$$\exp\left\{\frac{\left(\frac{\sigma \ln 10}{s}\right)^2}{2}\right\} \times \left[1-\phi\left(\frac{\sigma \ln 10}{s}+\frac{Vg-Vta-Vs}{\sigma}\right)\right] \quad (3)$$

for $$\phi(X) = 1 - \frac{1}{\sqrt{2\,\pi}} Erfc\left(\frac{x}{\sqrt{2\,\pi}}\right) \quad (4)$$

where Erfc is mathematically called the complementary error function.

Further in a practical range, it was found that $$IL = (N-1)A \exp\left[\ln 10\left\{BVd+\frac{Vg-Vta-Vs}{s}\right\}\right] \times$$

$$\exp\left\{\frac{\left(\frac{\sigma \ln 10}{s}\right)^2}{2}\right\} \quad (5)$$

Memory cells were manufactured as an experiment on a 0.6-μm rule to obtain the constant A of about exp(–51ln10) and the constant B of substantially 1.5.

From these results, when a memory cell array has an arrangement in which word lines and bit lines cross each other, N memory cells are connected to one bit line, and the upper limit value of a leakage current allowed by the read.detection/write circuit 23 connected to the bit lines is represented by IL, a sense amplifier or a write circuit in the read.detection/write circuit 23 connected to the bit lines does not malfunction if Vs satisfies $$Vgh - Vs - Vta + \frac{1.15\sigma^2}{s} < s\left\{5 - 1.5Vd + 0.4343 \ln\frac{IL}{N-1}\right\} \quad (6)$$

(ln is the natural logarithm)

where Vgh is the potential of a non-selected word line, Vta is the average threshold voltage of the memory cells in the memory cell array, σ is the standard deviation, s is the subthreshold coefficient of the memory cell, Vd is the potential of the bit line, Vs is the potential of the source line, and ln is the natural logarithm. That is, when the value of the leakage current IL allowed by the circuit is determined, the remaining parameters are determined to satisfy inequality (6).

To the contrary, if other parameters are given, the circuit scheme, circuit parameters, and use element sizes of the read.detection/write circuit 23 are set such that IL satisfies inequality (6).

In addition, erase and write operations may be repeatedly performed with respect to the memory cells to control and adjust Vta and σ until inequality (6) is satisfied.

Now, a case will be described in which the present invention is applied to the read.detection section of the read.detection/write circuit 23. Normally Vgh=Vs=0 V, so that $$-Vta + \frac{1.15\sigma^2}{s} < s\left(5 - 1.5Vd + 0.4343 \ln\frac{IL}{N-1}\right) \quad (7)$$

For example, when Vta=2 V, s=0.25 V/decade, σ=0.2 V, N=1,024, and Vd=1.5 V, the read.detection section must be designed not to malfunction with a leakage current of 100 nA. When a weak write operation is performed with respect to a memory cell in an excessively erased state to decrease σ to as small as 0.15 V, the read.detection section may only be designed not to malfunction with a leakage current of 47 nA, resulting in a wider design margin. In contrast, when the allowable leakage current in the read.detection section is up to 10 μA, and s=0.25 V/decade, σ=0.2 V, and N=1,024, and Vd=1.5 V, data can be erased until the central value of the threshold values is set to Vta=1.6 V.

Next, a case will be described in which the present invention is applied to the write section of the read.detection/write circuit 23. In a write operation, Vd has a value of about 6.5 V. If Vd is set at 6.5 V, and the remaining parameters are the same as those described above, the write section must not malfunction at 3.1 V, and also the write speed must not decrease. To the contrary, when the allowable leakage current of the bit lines is 100 μA at most, if s=0.25 V/decade, σ=0.2 V, and N=1,024, Vta must be set to 3.12 V or more.

Further, a case will be described in which the present invention is applied to a semiconductor memory device designed such that the allowable leakage current values of the read.detection and write sections of the read.detection/write circuit 23 are 10 μA and 100 μA, respectively.

In this case, an allowable value of Vta must be set to a larger one (i.e., 3.12 V or more) of the average threshold voltage Vta of 1.6 V determined in the read.detection section and the average threshold voltage Vta of 3.12 V determined in the write section.

The second embodiment of the present invention will be described below with reference to FIG. 7. In a nonvolatile semiconductor memory device shown in FIG. 7, memory cells MC in a memory cell array CA are divided into blocks, and selection transistors ST are provided to the respective blocks. These selection transistors ST are selectively controlled by a write block selection circuit 25 and a read block selection circuit 26 which are newly provided in addition to the circuits in the embodiment of FIG. 4. With this control, the number NP−1 of non-selected memory cells in a write operation (NP being the number of selected memory cells during the write operation) and the number NR−1 of non-selected memory cells in a read operation (NR being the number of selected memory cells during the read operation) can be changed. In this case, data can be erased until an erase threshold voltage is obtained which is determined by a larger one of the average threshold voltage Vta given by $$-Vta + \frac{1.15\sigma^2}{s} < s \left\{ 5 - 1.5Vdr + 0.4343 \ln \frac{IRL}{NR-1} \right\} \quad (8)$$

the average threshold voltage Vta given by $$-Vta + \frac{1.15\sigma^2}{s} < s \left\{ 5 - 1.5Vdp + 0.4343 \ln \frac{IPL}{NP-1} \right\} \quad (9)$$

On the other hand, if Vta is given in advance, read.detection and write sections are designed to satisfy $$Vgr - Vgp + Vsp - Vsr + 1.5s(Vdr - Vdp) + \quad (10)$$

$$0.4343s \ln \frac{IPL(NR-1)}{IRL(NP-1)} = 0$$

Note that in a special case of Vgr=Vgp=Vsp=Vsr=0 V, the read.detection and write sections are designed to satisfy $$(Vdr - Vdp) + 0.2895s \ln \frac{IPL(NR-1)}{IRL(NP-1)} = 0 \quad (11)$$

In some cases, Vsp may be applied in only a write operation. In this case, if Vta is given, the read.detection and write sections can be effectively designed to satisfy $$Vsp + 1.5s(Vdr - Vdp) + 0.4343s \ln \frac{IPLNR}{IRLNP} = 0 \quad (12)$$

In some cases, the potential Vgp may be applied to the word lines of non-selected memory cells in only a data write operation. If Vta is given, the read.detection and write sections can be effectively designed to satisfy $$-Vgp + 1.5s(Vdr - Vdp) + 0.4343s \ln \frac{IPL(NR-1)}{IRL(NP-1)} = 0 \quad (13)$$

More particularly, a specific value of the negative voltage Vgp to be applied to word lines can be determined.

The present invention can also be applied to a case in which one memory cell has any one of three or more different threshold voltages. In this case, when data is written in a memory cell in the circuit of the embodiment in FIG. 4 or 7, the write operation is performed to have three or more different threshold voltages. In a data read operation upon completion of the data write operation, the largest leakage current flows if all non-selected memory cells except for selected memory cells are set to have the smallest threshold voltage Vta0. Therefore, in this case, a circuit is designed to satisfy $$Vgh - Vs - Vta0 + \quad (14)$$

$$\frac{1.15\sigma^2}{s} < s \left\{ 5 - 1.5Vd + 0.4343 \ln \frac{IL}{N-1} \right\}$$

In addition, erase and write operations may be repeatedly performed to control and adjust Vta0 and σ until equation (14) is satisfied.

Note that the present invention is not limited to the above embodiments, and various changes and modifications may be deemed, as a matter of course. For example, although the above embodiments exemplify the case using a memory cell having a two-layered gate structure, another nonvolatile memory cell such as an MNOS can be used instead of this. In addition, the data write/erase method is not limited to the above embodiments.

Further, the above embodiments exemplify the case using a nonvolatile memory cell as a memory cell. However, the present invention can be similarly applied to a semiconductor memory device using single-layered gate transistors. In this case, the threshold voltage has a distribution reflecting variations in manufactured devices and the like, and the standard deviation corresponds to a control value in the manufacture.

As has been described above, according to the present invention, a design guideline can be obtained which copes with almost all the situations. In addition to this, effective design, setting of an operation voltage, division of bit lines, and the like can be realized within a short time. As a result, a high-performance, highly reliable semiconductor memory device and a method of adjusting the same can be provided.

What is claimed is:

1. A semiconductor memory device comprising:
    a plurality of word lines and a plurality of bit lines which are formed to cross each other;
    a memory cell array having a plurality of memory cells arrayed in a matrix, some of said memory cells arrayed in the same row being commonly connected to a corresponding one of said plurality of word lines, and some of said memory cells arrayed in the same column being commonly connected to a corresponding one of said plurality of bit lines; and
    a read.detection/write circuit connected to said plurality of bit lines to read, detect, and write data with respect to said memory cells,
    wherein the following inequality is established $$Vgh - Vs - Vta + \frac{1.15\sigma^2}{s} < s \left\{ 5 - 1.5Vd + 0.4343 \ln \frac{IL}{N-1} \right\}$$

where IL is an upper limit value of a leakage current allowed by said read.detection/write circuit, N (N is a positive integer) is the number of memory cells commonly connected to said one bit line, Vgh is a potential of said word lines to which non-selected memory cells are connected, Vta is an average threshold voltage of said plurality of memory cells in said memory cell array, σ is a standard deviation of the threshold voltages, s is a subthreshold coefficient of said memory cell, Vd is a potential of said bit lines, Vs is a source potential of said memory cells, and ln is a natural logarithm.

2. A device according to claim 1, wherein the potential Vgh is a ground potential.

3. A device according to any one of claims 1 and 2, wherein the potential Vs is a ground potential.

4. A device according to claim 1, wherein the potential Vgh is a negative potential.

5. A device according to claim 1, wherein said memory cells are nonvolatile memory cells.

6. A device according to claim 5, wherein said nonvolatile memory cells are nonvolatile transistors each having a source, a drain, a floating gate, and a control gate.

7. A semiconductor memory device comprising:

a plurality of word lines and a plurality of bit lines which are formed to cross each other;

a memory cell array having a plurality of memory cells arrayed in a matrix, some of said memory cells arrayed in the same row being commonly connected to a corresponding one of said plurality of word lines;

a switching circuit for changing the number of memory cells to be connected to one bit line in accordance with a data read.detection operation and a data write operation such that NR (NR is a positive integer) memory cells are connected to each of said bit lines in the data read.detection operation, and NP (NP is a positive integer) memory cells are connected to each of said bit lines in the data write operation; and a read.detection/write circuit connected to said plurality of bit lines and having a read.detection section for reading and detecting data from said memory cells and a write section for writing data in said memory cells, wherein an average threshold voltage Vta is set larger than either of values given by $$Vgr - Vsr + \frac{1.15\sigma^2}{s} - s \left\{ 5 - 1.5Vdr + 0.4343 \ln \frac{IRL}{NR-1} \right\}$$

and $$Vgp - Vsp + \frac{1.15\sigma^2}{s} - s \left\{ 5 - 1.5Vdp + 0.4343 \ln \frac{IPL}{NP-1} \right\}$$

where IRL is an upper limit value of a leakage current allowed by said read.detection section in the data read.detection operation, IPL is an upper limit value of a leakage current allowed by said write section in the data write operation, Vgr is a potential of said word lines connected to non-selected memory cells in the data read.detection operation, Vdr is a potential of said bit lines in the data read.detection operation, Vsr is a source potential of said memory cell in the data read.detection operation, Vgp is a potential of said word lines connected to non-selected memory cells in the data write operation, Vdp is a potential of said bit lines in the data write operation, Vsp is a source potential of said memory cells in the data write operation, Vta is the average threshold voltage of said plurality of memory cells in said memory cell array, σ is a standard deviation of the threshold voltage, s is a subthreshold coefficient of said memory cells, and in is a natural logarithm.

8. A device according to claim 7, wherein both the potentials Vgr and Vgp are ground potentials.

9. A device according to claim 7, wherein both the potentials Vsr and Vsp are a ground potential.

10. A device according to claim 7, wherein said memory cells are nonvolatile memory cells.

11. A device according to claim 10, wherein said nonvolatile memory cells are nonvolatile transistors each having a source, a drain, a floating gate, and a control gate.

12. A semiconductor memory device comprising:

a plurality of word lines and a plurality of bit lines which are formed to cross each other;

a memory cell array having a plurality of memory cells arrayed in a matrix, some of said memory cells arrayed in the same row being commonly connected to a corresponding one of said plurality of word lines;

a switching circuit for changing the number of memory cells to be connected to one bit line in accordance with a data read.detection operation and a data write operation such that NR (NR is a positive integer) memory cells are connected to each of said bit lines in the data read.detection operation, and NP (NP is a positive integer) memory cells are connected to each of said bit lines in the data write operation; and a read.detection/write circuit connected to said plurality of bit lines and having a read.detection section for reading and detecting data from said memory cells and a write section for writing data in said memory cells, wherein the following relation is satisfied $$Vgr - Vgp + Vsp - Vsr + 1.5s(Vdr - Vdp) +$$
$$0.4343s \ln \frac{IPL(NR-1)}{IRL(NP-1)} = 0$$

where IRL is an upper limit value of a leakage current allowed by said read.detection section in the data read.detection operation, IPL is an upper limit value of a leakage current allowed by said write section in the data write operation, Vgr is a potential of said word lines connected to non-selected memory cells in the data read.detection operation, Vdr is a potential of said bit lines in the data read.detection operation, Vgp is a potential of said word lines connected to non-selected memory cells in the data write operation, Vdp is a potential of said bit lines in the data write operation, s is a subthreshold coefficient of said memory cells, and in is a natural logarithm.

13. A device according to claim 12, wherein both the potentials Vgr and Vgp are ground potentials.

14. A device according to claim 12, wherein both the potentials Vsr and Vsp are ground potentials.

15. A method of adjusting a semiconductor memory device which comprises:

a plurality of word lines and a plurality of bit lines which are formed to cross each other;

a memory cell array having a plurality of memory cells which are arrayed in a matrix and constituted by nonvolatile transistors whose threshold voltages change by injecting/extracting electrons, some of said memory cells arrayed in the same row being commonly connected to a corresponding one of said plurality of word lines, and some of said memory cells arrayed in the same column being commonly connected to a corresponding one of said plurality of bit lines; and a read.detection/write circuit connected to said plurality of bit lines to read, detect, and write data with respect to said memory cells, comprising repeatedly injecting/extracting the electrons to adjust said memory cells such that an average threshold voltage Vta of said memory cells and a standard deviation σ of the threshold voltages satisfy $$Vgh - Vs - Vta + \frac{1.15\sigma^2}{s} < s \left\{ 5 - 1.5Vd + 0.4343 \ln \frac{IL}{N-1} \right\}$$

where IL is an upper limit value of a leakage current allowed by said read.detection/write circuit, N (N is a positive integer) is the number of memory cells commonly connected to said one bit line, Vgh is a potential of said word lines to which non-selected memory cells are connected, s is a subthreshold coefficient of said memory cell, Vd is a potential of said bit lines, Vs is a source potential of said memory cells, and ln is a natural logarithm.

16. A semiconductor memory device comprising:

a plurality of word lines and a plurality of bit lines which are formed to cross each other;

a memory cell array having a plurality of memory cells which are arrayed in a matrix and each of which can be set in states of at least three threshold voltages, some of said memory cells arrayed in the same row being commonly connected to a corresponding one of said plurality of word lines, and some of said memory cells arrayed in the same column being commonly connected to a corresponding one of said plurality of bit lines; and a read.detection/write circuit connected to said plurality of bit lines to read, detect, and write data with respect to said memory cells, wherein the following inequality is established $$Vgh - Vs - Vta + \frac{1.15\sigma^2}{s} < s \left\{ 5 - 1.5Vd + 0.4343\ln\frac{IL}{N-1} \right\}$$

where IL is an upper limit value of a leakage current allowed by said read.detection/write circuit, N (N is a positive integer) is the number of memory cells commonly connected to said one bit line, Vgh is a potential of said word lines to which non-selected memory cells are connected, Vta is an average threshold voltage of at least the three threshold voltages of said plurality of memory cells in said memory cell array, σ is a standard deviation of the threshold voltages, s is a subthreshold coefficient of said memory cell, Vd is a potential of said bit lines, Vs is a source potential of said memory cells, and ln is a natural logarithm.

17. A device according to claim 16, wherein the average threshold voltage Vta is set at an average threshold voltage of the smallest threshold values of at least the three threshold voltages.

18. A device according to claim 16, wherein said memory cells are nonvolatile memory cells.

19. A device according to claim 18, wherein said nonvolatile memory cells are nonvolatile transistors each having a source, a drain, a floating gate, and a control gate.

20. A method of adjusting a semiconductor memory device which comprises:

a plurality of word lines and a plurality of bit lines which are formed to cross each other;

a memory cell array having a plurality of memory cells which are arrayed in a matrix and each of which can be set in states of at least three threshold voltages, some of said memory cells arrayed in the same row being commonly connected to a corresponding one of said plurality of word lines, and some of said memory cells arrayed in the same column being commonly connected to a corresponding one of said plurality of bit lines; and a read.detection/write circuit connected to said plurality of bit lines to read, detect, and write data with respect to said memory cells, comprising repeatedly injecting/extracting the electrons to adjust said memory cells such that an average threshold voltage Vta of said memory cells and a standard deviation σ of the threshold voltages satisfy $$Vgh - Vs - Vta + \frac{1.15\sigma^2}{s} < s \left\{ 5 - 1.5Vd + 0.4343\ln\frac{IL}{N-1} \right\}$$

where IL is an upper limit value of a leakage current allowed by said read.detection/write circuit, N (N is a positive integer) is the number of memory cells commonly connected to said one bit line, Vgh is a potential of said word lines to which non-selected memory cells are connected, Vta is the average threshold voltage of said plurality of memory cells in said memory cell array, σ is the standard deviation of the threshold voltages, s is a subthreshold coefficient of said memory cell, Vd is a potential of said bit lines, Vs is a source potential of said memory cells, and ln is a natural logarithm.

* * * * *

UNITED STATES PATENT AND TRADEMARK OFFICE
CERTIFICATE OF CORRECTION

PATENT NO. : 5,734,612
DATED : March 31, 1998
INVENTOR(S) : Kuniyoshi YOSHIKAWA

It is certified that error appears in the above-indentified patent and that said Letters Patent is hereby corrected as shown below:

Title Page, Item [57], line 2, "read.detection/write" should read --read·detection/write--.

Claim 1, col. 10, line 44, "read.detection/write" should read --read·detection/write--.

Claim 1, col. 10, line 53, "read.detection/write" should read --read·detection/write--.

Claim 1, col. 10, line 61, "in" should read --In--.

Claim 7, col. 11, line 15, "read.detection" should read --read·detection--.

Claim 7, col. 11, line 18, "read.detection" should read --read·detection--.

Claim 7, col. 11, line 21, "read.detection/write" should read --read·detection/write--.

Claim 7, col. 11, line 22, "read.detection" should read --read·detection--.

Claim 7, col. 11, line 37, "read.detection" should read --read·detection--.

Claim 7, col. 11, lines 37-38, "read.detection" should read --read·detection--.

Claim 7, col. 11, line 41, "read.detection" should read --read·detection--.

Claim 7, col. 11, line 43, "read.detection" should read --read·detection--.

Claim 7, col. 11, line 44, "read.detection" should read --read·detection--.

UNITED STATES PATENT AND TRADEMARK OFFICE
CERTIFICATE OF CORRECTION

PATENT NO. : 5,734,612
DATED : March 31, 1998
INVENTOR(S) : Kuniyoshi YOSHIKAWA

It is certified that error appears in the above-indentified patent and that said Letters Patent is hereby corrected as shown below:

Claim 7, col. 11, line 52, "in" should read --ln--.

Claim 12, col. 12, line 5, "read.detection" should read --read·detection--.

Claim 12, col. 12, line 8, "read.detection" should read --read·detection--.

Claim 12, col. 12, line 11, "read.detection/write" should read --read·detection/write--.

Claim 12, col. 12, line 12, "read.detection" should read --read·detection--.

Claim 12, col. 12, line 23, "read.detection" should read --read·detection--.

Claim 12, col. 12, lines 23-24, "read.detection" should read --read·detection--.

Claim 12, col. 12, line 27, "read.detection" should read --read·detection--.

Claim 12, col. 12, line 29, "read.detection" should read --read·detection--.

Claim 12, col. 12, line 33, "in" should read --ln--.

Claim 15, col. 12, line 52, "read.detection/write" should read --read·detection/write--.

Claim 15, col. 12, line 64, "read.detection/write" should read --read·detection/write--.

Claim 15, col. 13, line 3, "in" should read --ln--.

UNITED STATES PATENT AND TRADEMARK OFFICE
CERTIFICATE OF CORRECTION

PATENT NO. : 5,734,612
DATED : March 31, 1998
INVENTOR(S) : Kuniyoshi YOSHIKAWA

It is certified that error appears in the above-indentified patent and that said Letters Patent is hereby corrected as shown below:

Claim 16, col. 13, line 14, "read.detection/write" should read --read·detection/write--.

Claim 16, col. 13, line 23, "read.detection/write" should read --read·detection/write--.

Claim 16, col. 13, line 32, "in" should read --In--.

Claim 20, col. 14, line 15, "read.detection/write" should read --read·detection/write--.

Claim 20, col. 14, line 29, "read.detection/write" should read --read·detection/write--.

Claim 20, col. 14, line 37, "in" should read --In--.

Signed and Sealed this

Seventeenth Day of August, 1999

Attest:

Q. TODD DICKINSON

*Attesting Officer*    Acting Commissioner of Patents and Trademarks